United States Patent [19]
Hemmeke et al.

[11] Patent Number: 5,685,629
[45] Date of Patent: Nov. 11, 1997

[54] VANITY MIRROR ASSEMBLY

[75] Inventors: Ronald L. Hemmeke; Corbin L. Collet, both of Holland, Mich.

[73] Assignee: Prince Corporation, Holland, Mich.

[21] Appl. No.: 315,148

[22] Filed: Sep. 29, 1994

[51] Int. Cl.⁶ .................... F21V 33/00; B60Q 3/02
[52] U.S. Cl. .................... 362/140; 362/135; 362/142
[58] Field of Search ..................... 362/135, 140, 362/142, 143, 144, 74; 439/56, 547, 554; 296/97.2, 97.5

[56] References Cited

U.S. PATENT DOCUMENTS

| | | |
|---|---|---|
| 4,075,468 | 2/1978 | Marcus . |
| 4,486,819 | 12/1984 | Marcus et al. . |
| 4,878,158 | 10/1989 | Svensson . |
| 4,879,637 | 11/1989 | Clark et al. . |
| 5,162,950 | 11/1992 | Suman et al. . |
| 5,205,635 | 4/1993 | Van Order et al. . |
| 5,267,090 | 11/1993 | Dowd et al. .......... 296/97.5 |
| 5,331,518 | 7/1994 | Roark et al. . |

*Primary Examiner*—Y My Quach
*Attorney, Agent, or Firm*—Price, Heneveld, Cooper, DeWitt & Litton

[57] ABSTRACT

A vanity mirror assembly electrical circuit includes stamped conductors with projections for affixing the conductors to a rigid insulative backing member. In a preferred embodiment, the backing member further serves to support the vanity mirror in a frame assembly. In a preferred embodiment, the projections comprise rosettes which mount the conductors to a fiberboard backing member.

14 Claims, 3 Drawing Sheets

5,685,629

VANITY MIRROR ASSEMBLY

BACKGROUND OF THE INVENTION

The present invention relates to a vanity mirror assembly and particularly one employed with a visor for a vehicle.

Visors frequently include illuminated vanity mirrors for use for the convenience of the vehicle operator or passenger. Such visors include cores which can be molded of a polymeric material or formed of a fiberboard material. The cores include an opening on the side facing the passenger compartment when the visor is lowered for receiving a vanity mirror package. Typically, the vanity mirror package will include a mirror frame of polymeric material to which the electrical components are mounted. Such circuit mounting arrangements include the use of discreet conductors such as physical wires or flat stamped circuit conductors which are held to the visor core or the mirror frame in a conventional manner such as by using heat stakes from a polymeric support which extend through apertures formed in the flat metal conductors. In the case of discreet wires, the wires typically are held in place in snap-in wire holding sockets integral with the mirror frame or visor core.

Other circuit mounting arrangements have been proposed including the printing of the electrical conductors for vanity mirror visors on a Mylar substrate adhesively attached to the rear surface of the mirror as represented by U.S. Pat. No. 5,162,950. U.S. patent application Ser. No. 154,216 filed on Nov. 17, 1993 entitled Covered Vanity Mirror and Flexible Circuit discloses a Mylar substrate on which flat conductors are mounted. The substrate and conductors subsequently mounted to the cover and frame of a vanity mirror assembly for a visor. Visor cores themselves have had a layer of conductive material define the electrical circuit paths as represented by U.S. Pat. No. 5,205,635.

Although these systems provide an improvement to the discreet circuit wiring for a vanity mirror, in some applications it remains desirable to use stamped electrical circuits and yet eliminate the additional cost requisite with the attachment of such circuits to a separate polymeric mirror frame assembly and the separate mounting of the mirror to such a frame.

SUMMARY OF THE PRESENT INVENTION

The vanity mirror assembly of the present invention provides a unique circuit for mounting stamped electrical circuit components on a backing member which further serves to support the vanity mirror in a frame assembly. In one embodiment of the invention, the vanity mirror assembly is mounted to a vehicle visor. In a preferred embodiment of the invention the electrical circuit comprises flat stamped electrical conductors having rosette shaped protrusions formed therein which mount the conductors to a circuit board made of an insulative material. In a preferred embodiment of the invention the backing member is made of a rigid fiberboard material.

The resultant structure allows the circuit board to serve the dual function of providing a circuit board and mirror mounting support in an easy to manufacture and relatively inexpensive but reliable assembly. These and other features, objects and advantages of the present invention will become apparent upon reading the following description thereof together with reference to the accompanying drawings in which:

DETAILED DESCRIPTION OF THE PREFERRED EMBODIMENT

Figure 1:
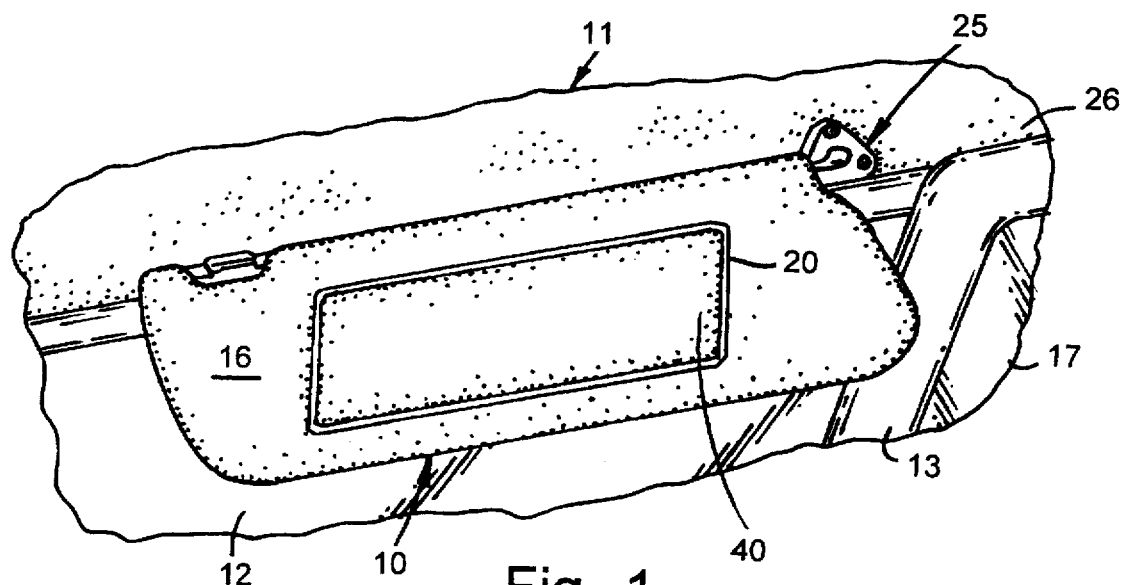
FIG. 1 is a fragmentary perspective view of a vehicle including a covered vanity mirror visor embodying the present invention.
Figure 2:
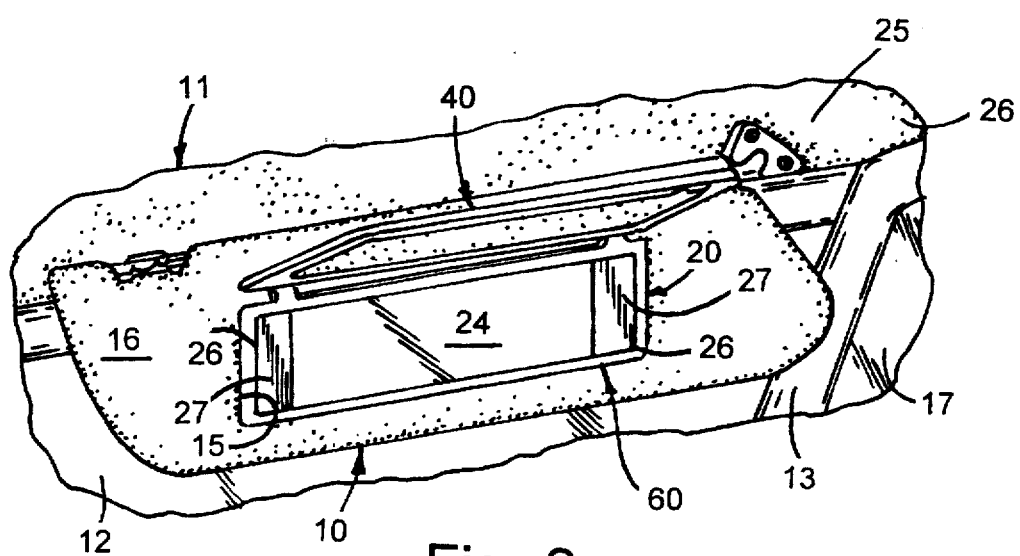
FIG. 2 is a perspective view of the visor shown in FIG. 1 showing the cover in an open position.

Referring initially to FIGS. 1 and 2, them is shown a vehicle accessory such as a visor 10 embodying the present invention installed in a vehicle such as an automobile 11. The visor shown is mounted to the right front passenger area adjacent windshield 12 and the "A" pillar 13. Visor 10 includes a pivot mounting assembly 25 for mounting the visor to the roof 26 of the vehicle for movement between the lowered use position illustrated and a raised, stored position adjacent the roof. Conventionally, the mounting assembly allows the visor to pivot from the windshield position as shown to a position adjacent the side window 17. The visor includes a core 30 (FIG. 3) which can be molded of polypropylene or as in the preferred embodiment, be a fiberboard material of the construction disclosed in U.S. Pat. No. 5,007,532 issued Apr. 16, 1992 entitled Visor and Method of Making the Same. Core 30 integrally includes a front panel 32, a rear panel 34 with the front panel including an aperture 31 for receiving an illuminated vanity mirror assembly 20 therein. As seen in FIGS. 1 and 2, core 30 is covered with an upholstery material 16 to conform the visor to the interior appearance of the vehicle.

Figure 3:
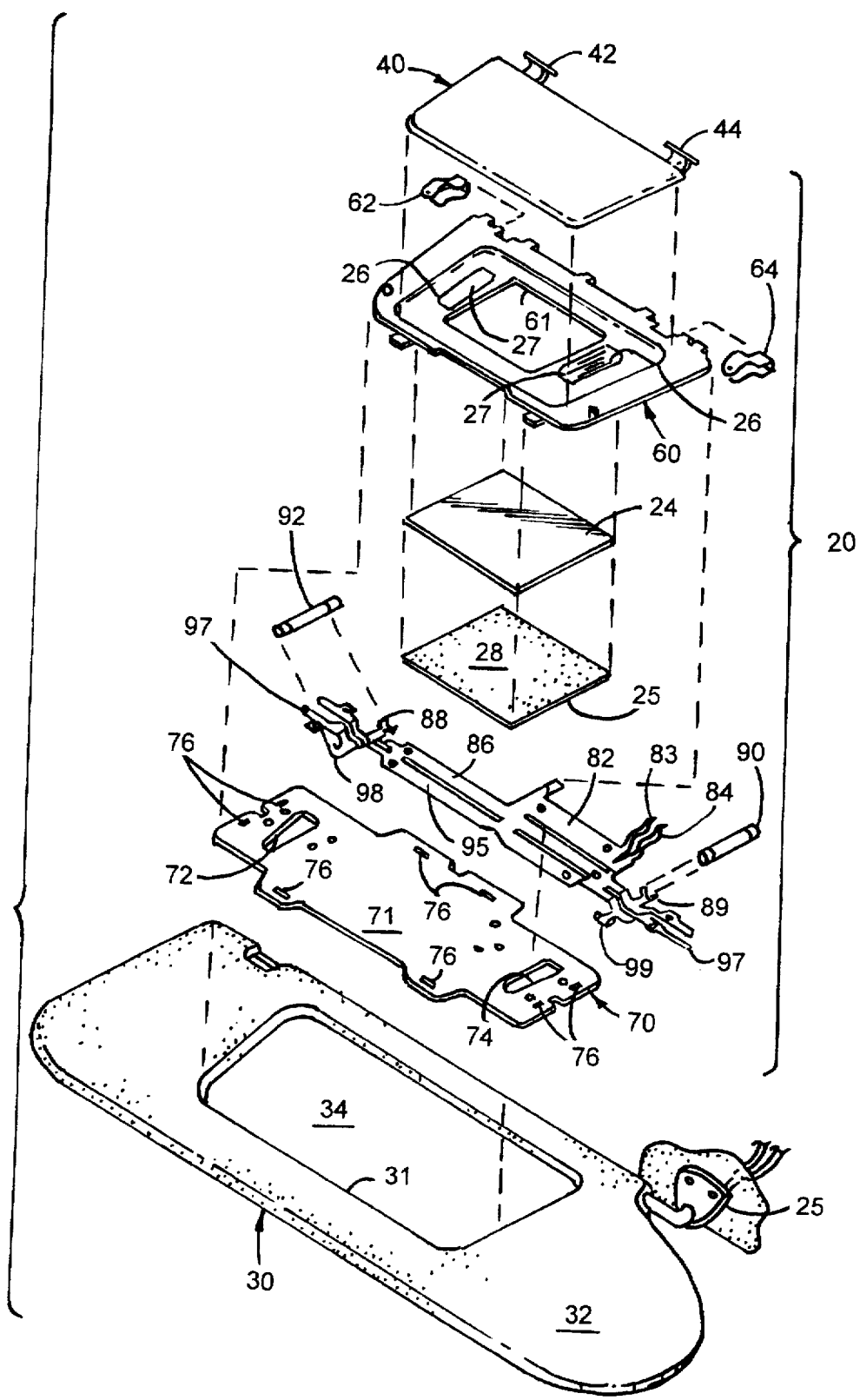
FIG. 3 is an enlarged exploded perspective view of the visor assembly embodying the present invention.

Assembly 20, as best seen in FIG. 3, includes a cover 40 for a mirror 24 mounted to a mirror frame 60. For such purpose frame 60 includes and opening 61 which includes a rectangular mirror receiving recess on the rear surface of frame 60 such that the peripheral edges of the mirror 24 are supported to align mirror 24 within aperture 61. The recess has a depth such that the backing member 70 will, when attached to the frame 60, compressively hold mirror 24 to the frame 60. Located on opposite sides of the mirror opening 61 and fitted within apertures 26 in frame 60 are a pair of lenses 27 which are snap mounted within the apertures 26 in a conventional manner.

Cover 40 is pivotally mounted to the frame 60 by means of pivot arms 42 and 44 on cover 40 which snap-fit within sockets formed in the rear side of the frame and are mounted thereto by spring clips 62 and 64 for providing over-center snap-open and snap-closed operation of the cover 40 as disclosed in greater detail in U.S. Pat. No. 5,331,518 issued on Jul. 19, 1994 entitled Visor Mirror Cover Assembly, the disclosure of which is incorporated herein by reference.

The rear surface of mirror 24 is covered by a pad 25 of foam polymeric material having a self-sticking adhesive surface 28 for securing the pad 25 to the rear non-reflective surface of mirror 24. Positioned behind the mirror and frame is a circuit stamping 80 secured to a circuit and backing member 70 prior to final assembly. Member 70 is secured to the frame 60 with the circuit stamping 80, together with cartridge-type lamps 90 and 92, preassembled to member 70 and the combination then being preassembled into the vanity mirror package 20 as described in greater detail in connection with the remaining Figures.

Figure 4:
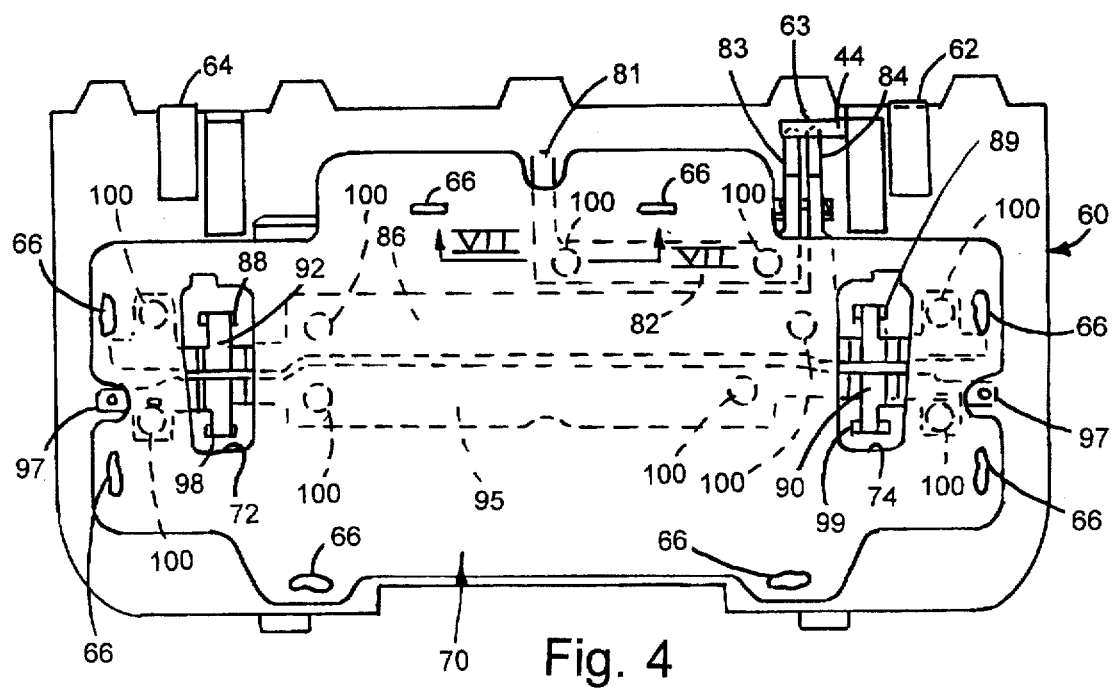
FIG. 4 is an enlarged rear elevational view of the assembled vanity mirror assembly shown in FIGS. 1–3.
Figure 5:
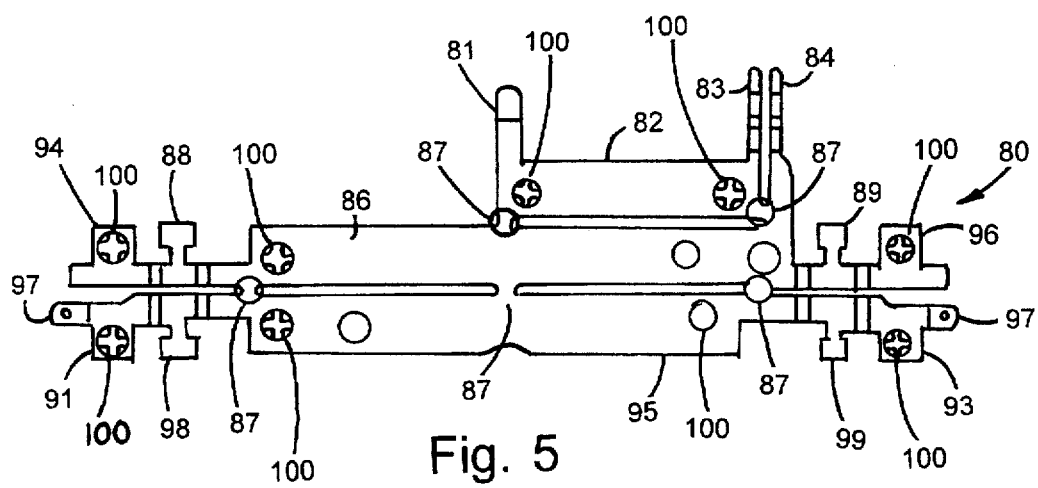
FIG. 5 is a rear elevational view of the electrical circuit stamping for the visor assembly shown prior to assembly.

The circuit stamping 80 is best seen in FIG. 5 and comprises stamped integrally formed flat conductive strips 82, 86, and 95 made of sheet brass or other suitable conductive material. Strip 82 includes an input terminal 81 which receives a supply terminal coupled to the vehicle's positive electrical supply in a conventional manner. Terminal 81 extends to a first finger 83 through a conductive strip 82 with finger 83 forming one contact of an electrical switch defined in part by a remaining contact 84. The switch defined by finger contacts 83 and 84 is completed by a shorting bar 63 extending over the pivot arm 44 of cover 40 (FIG. 4) such that when cover 40 is open, shorting bar 63 engages fingers 83 and 84 to complete the electrical circuit path therebetween. Prior to assembly, strip 82 is coupled a center conductive strip 86 by means of bridging sections 87 shown circled in FIG. 5.

Conductive strip 86 includes near one end, a first cylindrical lamp receiving socket 88 and near an opposite end in a second lamp receiving socket 89. Extending outwardly from the end of sockets 88 and 89 are mounting tabs 94 and 96, each with a rosette fastener 100 constructed as shown in greater detail in FIG. 6 described below. A plurality of such rosette fasteners 100 are located in spaced relationship in each of the strips 82, 86, and 95 as seen in FIGS. 4, 5, and 7. The center strip 86 of the circuit stamping 80 as well as strip 82 and strip 95 are coupled together prior to assembly by additional bridge sections 87 circled in FIG. 5.

Circuit strip 95 extends in parallel spaced relationship to conductive strip 86 and includes near one end a socket 98 for receiving a cartridge lamp 92 as seen in FIG. 4 and near the opposite end in a socket 99 for receiving lamp 90 as also shown in FIG. 4. The ends of strip 95 terminate in mounting tabs 91 and 93, each with integral rosette fasteners 100 formed therein. Tabs 91 and 93 further include electrical terminals 97 one of which being coupled by a conductor (not shown) to the vehicle's electrical ground in a conventional manner.

The circuit stamping 80 so formed is pressed into the fiberboard circuit board and backing member or plate 70 utilizing a suitable press. The lamp sockets defined by curved members 88 and 98 on one end and similar sockets 89 and 99 on the opposite end are aligned with apertures 72 and 74 of backing member 70 as best seen in FIG. 4. The backing member 70 is made of a rigid planar insulative material and preferably a rigid fiberboard having a thickness of about 1/16 of an inch in the preferred embodiment. In addition to the bulb receiving apertures 72 and 74, backing member 70 includes a plurality of mounting slots 76 (FIG. 3) located in spaced relationship around the periphery of the backing member for receiving heat staking terminals 66 extending from the rear surface of polymeric frame 60. The heat staking terminals extend through slots 76 and subsequently are welded over to mount the backing member and the preassembled circuit stamping 80 thereon to the mirror frame 60 to complete the vanity mirror assembly 20.

Figure 6:
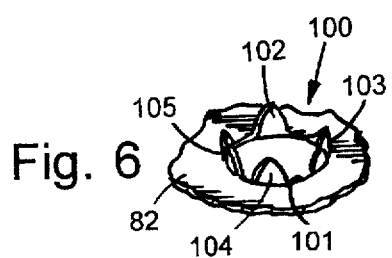
FIG. 6 is an enlarged fragmentary perspective view of one of the mounting rosettes employed on the circuit stamping shown in FIG. 5.
Figure 7:
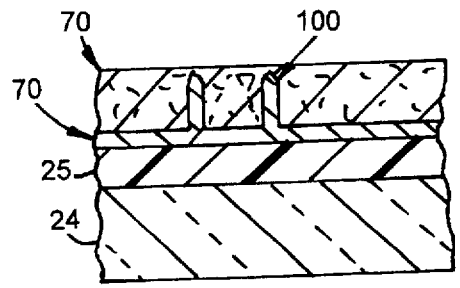
FIG. 7 is an enlarged fragmentary cross-sectional view taken along section line VII—VII of FIG. 4.

In order to mount the circuit stamping 80 to the backing member 70, a plurality of rosettes 100 are employed and are shown in greater detail in FIGS. 6 and 7. Each of the rosettes are formed by a stamping process by forming an aperture through the conductive strip 82 shown in FIG. 6 to define an aperture 101 in the conductor having pointed spaced peripheral rearwardly projecting projections 102–105. These projections extend upwardly from the periphery of aperture 101 in a direction toward the inner surface 71 (FIG. 3) of backing member 70. In a preferred embodiment of the invention, each of the protrusions 102–105 have a length substantially equal to the thickness of the backing member 70 and as seen FIG. 7, once press fit into the backing member, extend substantially through the backing member to secure the circuit stamping 80 to the circuit board and backing member 70.

Once the circuit stamping 80 is press fit onto the backing member 70, the bridging sections 87 are removed by a cutting process and the sub-assembly comprising the backing member now circuit board 70, circuit stamping 80 and lamps 90 and 92 inserted in the sockets of the circuit, is attached to the preassembled mirror frame and cover assembly and heat staking terminals 66 welded to secure the vanity mirror assembly together in a sub-assembly as shown in FIG. 4. The sub-assembly is then snap-fit into the aperture 31 and the visor core 30 to complete the visor assembly.

Thus, with the system of the present invention, the electrical circuit is pre-mounted to a backing member which in turn holds the mirror within the mirror receiving frame of a vehicle visor behind the mirror opening 61 of the frame to provide a relatively inexpensive compact visor assembly which eliminates the necessity of adhesive bonding or other specific additional fastening structure for the conductive members to the visor assembly. The dual function of the backing member serving as a circuit board substrate for circuit stamping 80 as well as the mounting member for securing mirror 24 within the mirror frame 60 further reduces the cost of the vanity mirror assembly and enhances its reliability.

It will become apparent to those skilled in the art that various modifications to the preferred embodiment of the invention as described herein can be made without departing from the spirit or scope of the invention as defined by the appended claims.

The embodiments of the invention in which an exclusive property or privilege is claimed are defined as follows:

1. A vanity mirror assembly comprising:

a mirror frame including an opening supporting a mirror therein in alignment with said opening and at least one aperture adjacent said mirror opening for directing light therefrom;

an electrical circuit comprising stamped electrical conductors having at a plurality of spaced locations, at least one set of spaced opposed pointed projections formed with edges adjacent a common aperture at each location in each of said conductors and extending in a direction away from said mirror, said electrical circuit including at least one lamp mounted thereto;

a rigid planar backing member made of an insulative material wherein said opposed pointed projections of said electrical circuit extend into said backing member for holding said electrical circuit to said backing member; and fasteners positioned at predetermined locations on said frame for attaching said backing member to said frame for positioning said lamp of said electrical circuit in alignment with said aperture of said frame and for holding said mirror to said frame.

2. The vanity mirror assembly as defined in claim 1 wherein said backing member is made of fiberboard.

3. The vanity mirror assembly as defined in claim 1 wherein said conductors comprise a plurality of interconnected strips of flat conductors with bridging sections shaped to be removed subsequent to a press-fitting of said circuit into said backing member by said projections.

4. A vanity mirror assembly comprising:

a mirror frame including an opening supporting a mirror therein in alignment with said opening and at least one aperture adjacent said mirror opening for directing light therefrom;

an electrical circuit comprising stamped electrical conductors having a plurality of spaced projections extending in a direction away from said mirror, wherein said projections of said circuit define rosettes, said electrical circuit including at least one lamp mounted thereto;

a rigid planar backing member made of an insulative material receiving said projections of said electrical circuit for holding said electrical circuit to said backing member; and fasteners positioned at predetermined locations on said frame for attaching said backing member to said frame for positioning said lamp of said electrical circuit in alignment with said aperture of said frame and for holding said mirror to said frame.

5. A vanity mirror assembly comprising:

a mirror frame including an opening supporting a mirror therein in alignment with said opening and at least one aperture adjacent said mirror opening for directing light therefrom;

an electrical circuit comprising stamped electrical conductors having a plurality of spaced projections extending in a direction away from said mirror, wherein said projections of said circuit define rosettes shaped to be press-fit into a backing member, said electrical circuit including at least one lamp mounted thereto and wherein said conductors comprise a plurality of interconnected strips of flat conductors with bridging sections shaped to be removed subsequent to press-fitting of said circuit into said backing member by said projections;

a rigid planar backing member made of an insulative material for receiving said projections of said electrical circuit for holding said electrical circuit to said backing member; and fasteners positioned at predetermined locations on said frame for attaching said backing member to said frame for positioning said lamp of said electrical circuit in alignment with said aperture of said frame and for holding said mirror to said frame.

6. The vanity mirror assembly as defined in claim 5 wherein said backing member is made of fiberboard.

7. A circuit assembly for an illuminated vanity mirror comprising:

a mirror having a front and a rear surface;

a generally rectangular rigid planar fiberboard member shaped to cover said rear surface of said mirror of a vanity mirror assembly; and an electrical circuit comprising stamped electrical conductors having at a plurality of spaced locations, at least one set of spaced opposed pointed projections formed with edges adjacent a common aperture at each location in each of said conductors and extending into said fiberboard member in a direction away from the mirror for holding said electrical circuit to said member.

8. A circuit assembly for an illuminated vanity mirror comprising:

a mirror having a front and a rear surface;

a generally rectangular rigid planar fiberboard member shaped to cover said rear surface of said mirror of a vanity mirror assembly; and an electrical circuit comprising stamped electrical conductors having at a plurality of spaced locations a plurality of spaced opposed pointed projections extending into said fiberboard member for holding said electrical circuit to said member, wherein each of said plurality of said opposed pointed projections define a rosette.

9. The circuit assembly as defined in claim 8 wherein said electrical circuit includes at least one socket and wherein said fiberboard member includes an aperture aligned with said socket.

10. The circuit assembly as defined in claim 9 and further including a lamp mounted in said socket.

11. A circuit assembly for an illuminated vanity mirror comprising:

a generally rectangular rigid planar fiberboard member shaped to cover a surface of a mirror of a vanity mirror assembly; and an electrical circuit comprising stamped electrical conductors having a plurality of spaced pointed projections extending into said fiberboard member for holding said electrical circuit to said member, wherein each of said plurality of said projections define a rosette.

12. The circuit assembly as defined in claim 11 wherein said electrical conductors include at least one lamp socket integrally formed therein.

13. The circuit assembly as defined in claim 12 wherein said circuit comprises three parallel spaced conductive strips with a first of said strips including a pair of spaced switch defining contacts.

14. A circuit assembly for an illuminated vanity mirror comprising:

a generally rectangular rigid planar fiberboard member shaped to cover a surface of a mirror of a vanity mirror assembly; and an electrical circuit comprising stamped electrical conductors comprising three parallel spaced conductive strips with a first of said strips including a pair of spaced switch defining contacts, said strips having a plurality of spaced pointed projections extending into said fiberboard member for holding said electrical circuit to said member, wherein each of said plurality of said projections define a rosette, and wherein said electrical conductors include at least one lamp socket integrally formed therein, and wherein said fiberboard member includes an aperture aligned with said lamp socket.

* * * * *

UNITED STATES PATENT AND TRADEMARK OFFICE
CERTIFICATE OF CORRECTION

PATENT NO. : 5,685,629
DATED : November 11, 1997
INVENTORS : Hemmeke et al.

It is certified that error appears in the above-identified patent and that said Letters Patent is hereby corrected as shown below:

Column 1, line 27;
After "and conductors" insert --are--.

Column 2, line 18;
"them" should be --there--.

Column 2, line 41;
"and" should be --an--.

Column 3, line 3;
"Figures" should be --figures--.

Column 3, line 17;
After "coupled" insert --to--.

Column 4, line 4;
"and as seen" should be --and, as seen in--.

Column 4, line 7;
Delete "board".

Column 5, line 37;
Delete "for".

Signed and Sealed this

Tenth Day of March, 1998

Attest:

BRUCE LEHMAN

Attesting Officer

Commissioner of Patents and Trademarks